United States Patent [19]
DeWitt et al.

[11] Patent Number: 5,210,759
[45] Date of Patent: May 11, 1993

[54] DATA PROCESSING SYSTEM HAVING SCAN TESTING USING SET LATCHES FOR SELECTIVELY OBSERVING TEST DATA

[75] Inventors: Bernard C. DeWitt; Michael G. Gallup, both of Austin, Tex.

[73] Assignee: Motorola, Inc., Schaumburg, Ill.

[21] Appl. No.: 615,190

[22] Filed: Nov. 19, 1990

[51] Int. Cl.$^5$ .................... G06F 11/22; G01R 31/28
[52] U.S. Cl. .................... 371/22.3; 371/22.1; 371/22.5
[58] Field of Search .............. 371/15.1, 16.1, 22.1, 371/22.2, 22.3, 22.4, 22.5, 22.6, 25.1; 324/73.1, 158 R

[56] References Cited

U.S. PATENT DOCUMENTS

| | | | |
|---|---|---|---|
| 3,761,695 | 9/1973 | Eichelberger | 371/25.1 X |
| 4,554,664 | 11/1985 | Schultz | 371/22.3 |
| 4,698,588 | 10/1987 | Hwang | 324/158 R X |
| 4,701,920 | 10/1987 | Resnick | 371/22.5 |
| 4,931,722 | 6/1990 | Stoica | 371/22.5 |
| 4,942,577 | 7/1990 | Ozaki | 371/25.1 X |
| 4,947,395 | 8/1990 | Bullinger | 371/22.6 X |
| 4,975,641 | 12/1990 | Tanaka | 324/73.1 X |
| 4,980,889 | 12/1990 | DeGuise | 371/22.1 X |
| 5,056,094 | 10/1991 | Whetsel | 371/25.1 |
| 5,130,568 | 7/1992 | Miller | 371/22.3 X |

FOREIGN PATENT DOCUMENTS 0038182  2/1988  Japan ..................... 371/15.1

OTHER PUBLICATIONS

Generalized Scan Test Technique For VLSI Circuits (IBM Technical Disclosure Bulletin vol. 28 No. 4), Sep. 1985, 1600–1604.

Primary Examiner—Robert W. Beausoliel, Jr.
Assistant Examiner—Glenn Snyder
Attorney, Agent, or Firm—Robert L. King

[57] ABSTRACT

A data processing system uses a scannable test circuit to provide transistor fault testing of a large amount of random transistor logic. In a test mode of operation, a plurality of Master-Slave latches are used to observe the output of a plurality of data path drivers activated during a scan test operation. The data path drivers are included as part of the random transistor logic, and the outputs of the data path drivers are connected to a set input of the Master portion of one of a plurality of Master-Slave latches. The Master-Slave latches can be scanned to provide a test signal providing transistor fault information in the data processing system.

13 Claims, 4 Drawing Sheets

DATA PROCESSING SYSTEM HAVING SCAN TESTING USING SET LATCHES FOR SELECTIVELY OBSERVING TEST DATA

FIELD OF THE INVENTION

This invention relates generally to data processors with test logic, and more particularly, to data processors with scan testing logic.

BACKGROUND OF THE INVENTION

Data processors of increasing complexities are requiring a more thorough, efficient and less time-consuming approach to testing the various components within each data processor. Current methods of testing logic circuitry contained within a data processor include comprehensive functional testing, providing special test modes to read the contents of data registers, PLAs, ROMs, RAMs and other data storage elements incorporated within the data processor, and various data scanning techniques using data latches. Data scanning typically involves serially inputting a plurality of digital bits having predetermined logic values into a circuit being tested and detecting whether a predetermined digital output value is provided in response to the inputting of digital bits.

Typically, data scanning is limited to PLA circuitry or other repetitive, modular circuitry within a data processor. However, a need exists to be able to test most or all of the logic circuitry within a data processor from both a functional basis and a transistor fault basis. Testing is generally characterized as either functional testing or fault testing. A problem commonly associated with increasing the amount of logic circuitry which can be transistor fault tested by data scanning is an associated increase in circuitry required to perform the fault testing. Since an increase in circuit die size directly increases the cost of an integrated circuit, transistor fault test circuitry is typically considered to be a luxury which is not affordable in most applications. In addition, any circuitry which is added to perform functional and transistor fault testing may seriously impact speed performance of the logic circuitry being tested. As a result, test circuitry must not be inserted into any speed critical circuit paths.

SUMMARY OF THE INVENTION

A data processing system and method of operation is provided having scan testing for observing test data related to transistor structural testing of the system. A plurality of test scan latches receive and store predetermined input scan data and have a plurality of outputs. Each output provides a test data value. Logic circuitry is provided for performing predetermined data processing functions in the data processing system. The logic circuitry is coupled to the test scan latches and has a plurality of output driver circuits for selectively providing output control signals during a functional mode of operation and for selectively providing test output signals during a test mode of operation in response to receipt of the test data values from the test scan latches. A processing portion is coupled to the logic circuitry and implements a predetermined data processing function in the data processing system in response to the output control signals. A plurality of scannable latch circuits is provided with each latch circuit having a control input connected to a predetermined output control signal provided by the logic circuitry. Each latch circuit selectively stores a control signal at a predetermined time during the test mode of operation and provides a test output signal in response to the predetermined input scan data. The test output signal indicates transistor fault information of transistors in the logic circuitry.

DESCRIPTION OF A PREFERRED EMBODIMENT

Figure 1:
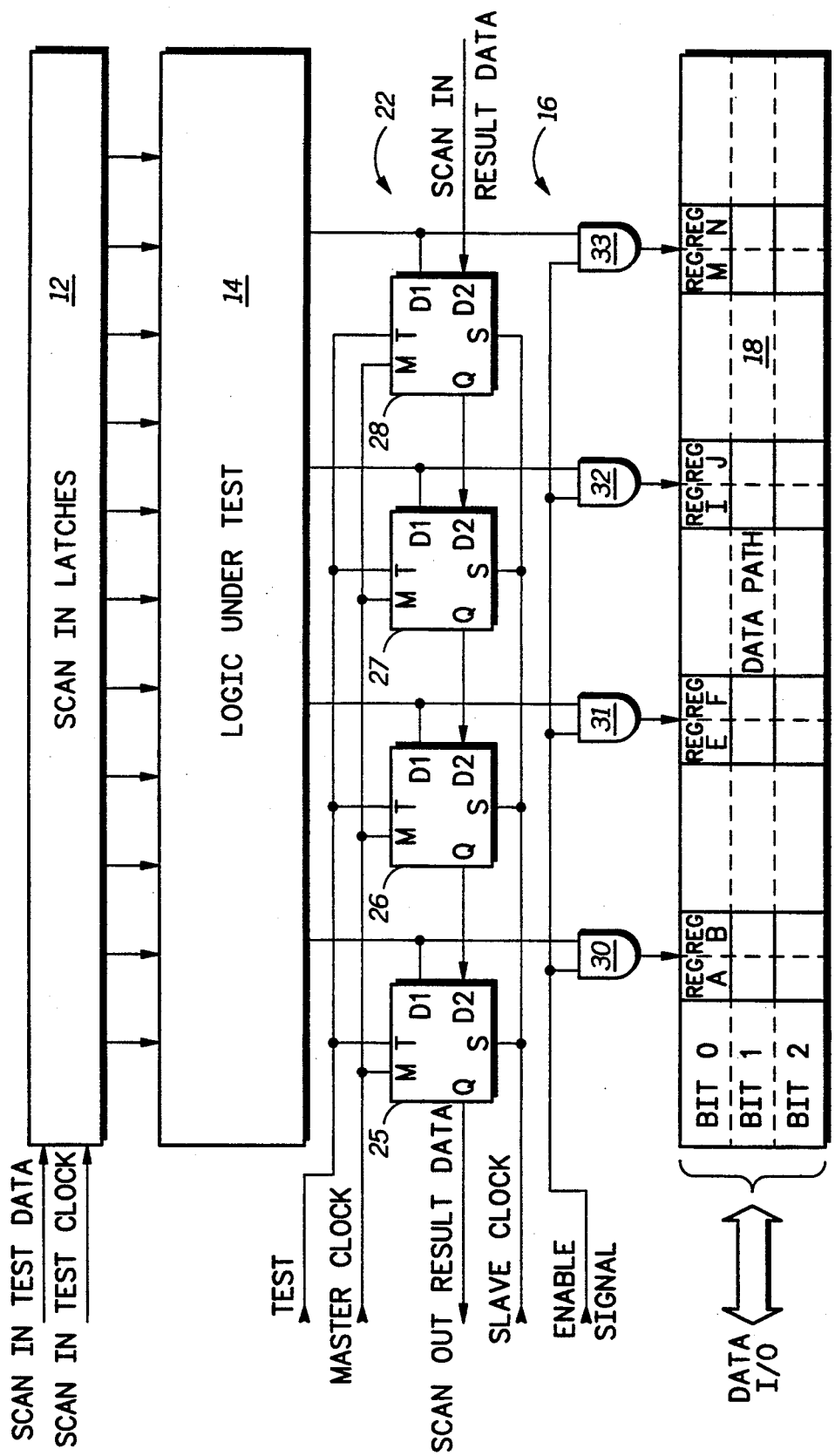
FIG. 1 illustrates in block diagram form a scan test system with scan latches.

Illustrated in FIG. 1 is a scan test system 10 of a data processor. Scan test system 10 has Scan In Latches 12 comprising a plurality of scan latches, a Logic Under Test (LUT) portion 14, a data path driver portion 16 with data path driver circuits 30–33, a data path 18, and a scan chain portion 22 with scan latch circuits 25–28. Scan In Latches 12 are a plurality of series connected latches (not shown) which serially receive "scan in test data" in response to a "scan in test clock". The Logic Under Test portion 14 has a plurality of inputs connected to a plurality of outputs of the Scan In Latches 12 and has a plurality of outputs. Each of scan latch circuits 25–28 is a conventional two-input Master/Slave D-type latch circuit. A first data input, (D1), of each of scan latch circuits 25–28 is connected to a predetermined one of the plurality of outputs of the Logic Under Test portion 14. A second data input, (D2), of each of scan latch circuits 25–28 is connected to a Q output of a preceding scan latch circuit. The D2 input of latch circuit 28 receives a predetermined scan in data bit value. This predetermined bit value can either be a logic zero or can be data from other test scan chains (not shown) which are testing other combinatorial logic (not shown) within the data processing system. The additional input, D2, at the input to the Master portion of the Master-Slave latch is to allow scan latch circuits 25–28 to be connected in series to form a chain of scan latches. The Logic Under Test portion 14 contains control logic that is generally random, complex and often speed-critical. Each output of the Logic Under Test portion 14 is captured in a Master portion (not shown) of one of scan latch circuits 25–28 in response to a Test signal which is active only during a Test mode of operation of scan test system 10. A Slave portion (not shown) of each of scan latch circuits 25–28 provides scan out result data at a Q output thereof.

The master and slave portions of each of scan latch circuits 25–28 are respectively controlled by a master clock and a slave clock respectively received at master (M) and slave (S) clock inputs. The slave portion of each of scan latch circuits 25–28 is necessary to prevent the latched data within the master portion from being overwritten during a data shifting/scanning operation. Each data path driver circuit has a first input connected to an Enable signal which is always active during a functional mode of operation but is selectively active during a test mode of operation. Each data path driver circuit has a second input connected to a predetermined one of the plurality of outputs of the Logic Under Test portion 14. An output of each of data path driver circuits 30-33 provides a control signal which is connected to the data path 18 for controlling the switching of data registers, such as A, B, E, F, I, J, M and N, via a data input/output (I/O) data bus.

In operation, scan test system 10 functions in either a functional mode of operation or a test mode of operation. In the functional mode of operation, scan in latches 12 and scan latch circuits 25-28 are not active. In other words, test data is neither scanned into or out of system 10 in the functional mode of operation. The Logic Under Test portion 14 functions to implement predetermined data processing operations and selectively provides control signals to driver circuits 30-33 for controlling data flow in data path 18. The Logic Under Test portion 14 is typically clocked by a system clock signal (not shown) so that the outputs of data drivers 30-33 are selectively active during the functional mode of operation.

In the test mode of operation, the transistor circuitry of Logic Under Test portion 14 is fault tested for detection of transistor structural faults such as electrical open circuits or short circuits. Scan latch circuits 25-28 of Scan Chain portion 22 are first initialized to a known state by scanning an inactive state into each of the scan latch circuits in response to the Master and Slave clock signals. Next, the scan in test data is shifted/scanned into Scan In Latches 12 under control of the scan in test clock. The scan in test data contained within Scan In Latches 12 provides the input stimulus for testing Logic Under Test portion 14. Since Logic Under Test portion 14 is combinational logic, the scan in test data "ripples" through the combinational logic contained within Logic Under Test portion 14 and remains static at the output of Logic Under Test portion 14. The output of Logic Under Test portion 14 represents the test output as a function of the scan in test data stimulus and the combinational logic contained within Logic Under Test portion 14. Each output signal of Logic Under Test portion 14 is then selectively latched into the Master portion of a predetermined scan latch circuit contained within Scan Chain portion 22 in response to the Test signal. The Master and Slave clocks are then activated by test control logic (not shown) to shift/scan out the data latched within the Scan Chain portion 22 of scan latch circuits 25-28 to a test register (not shown). The test register is typically within the data processing system and is subsequently read by an external tester.

A previous problem encountered with scan testing is the ability to latch or observe the output of logic circuits contained within Logic Under Test portion 14 when the outputs are enabled by a clocked input signal. The output of the logic circuits with clocked inputs are valid only during a specific period of time and thereby present a unique problem for scan testing. A general class of logic circuits whose outputs are valid only during a specific period of time is a "data path driver circuit" such as driver circuits 30-33. There are typically two inputs to a data path driver circuit as shown in FIG. 1. The first input to the data path driver circuit is a data input signal and the second input to the data path driver circuit is the clocked Enable signal. The data input signal is the output of control logic and is usually speed critical in terms of being valid before the Enable signal becomes active. In both the functional mode and the scan test mode, the output control signals of Logic Under Test system 14 are typically available only in response to a data processing system clock signal or a sequence of clock signals (not shown). When the control output of Logic Under Test portion 14 is active and the clocked Enable signal is active, the outputs of data path driver circuits 30-33 are active.

One of the objectives of scan testing is to group as much functionally related logic together as possible to form a Logic Under Test unit. The scan test system 10 of FIG. 1 illustrates that the Data Path Driver portion 16 is not included as part of Logic Under Test portion 14. Since the Data Path Driver portion 16 is not included within Logic Under Test portion 14, the data path driver circuits within the Data Path Driver portion 16 will not be fault tested along with Logic Under Test portion 14. This may be considered a disadvantage. A primary reason why Data Path Driver portion 16 is not directly included with Logic Under Test portion 14 is that a race condition exists when a data path driver circuit output transitions from an active state to an inactive state in response to the input Enable signal transitioning from an active state to an inactive state, and when the output of a data path driver circuit is latched into the Master portion of a scan latch circuit in response to the Test clock signal transitioning from an active state to an inactive state. A primary reason why this race condition exists is that the Enable signal and Test clock signal timing (active and inactive times) are similar if not identical. The inherent race condition described above may preclude the latching of a valid output of a data path driver circuit signal by a scan latch circuit. A solution to this potential inherent race condition is realized in test system 10 by inserting the scan latch circuits between Logic Under Test portion 14 and the data path driver circuits. As previously mentioned, the outputs of Logic Under Test portion 14 are static and can therefore be latched into the Master portion of a Master-Slave latch without the concern of a race condition. However, since scan latch circuits 25-28 are directly connected to the control outputs of Logic Under Test portion 14, the outputs are thereby additionally capacitively loaded which can have a potentially undesirable effect on the logic circuitry within Logic Under Test portion 14 during the functional mode of operation.

Figure 2:
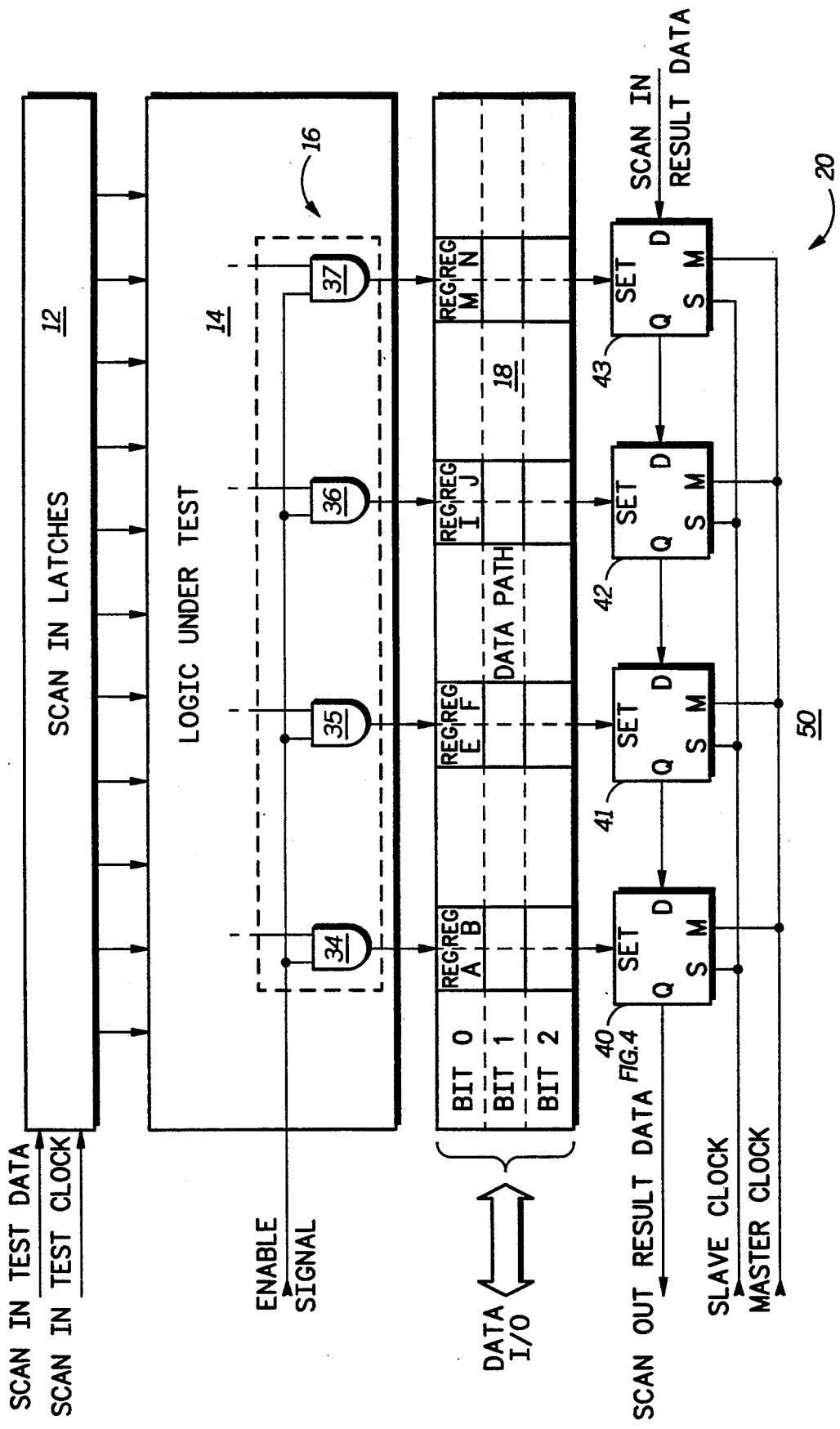
FIG. 2 illustrates in block diagram form a scan test system in accordance with the present invention.
Figure 4:
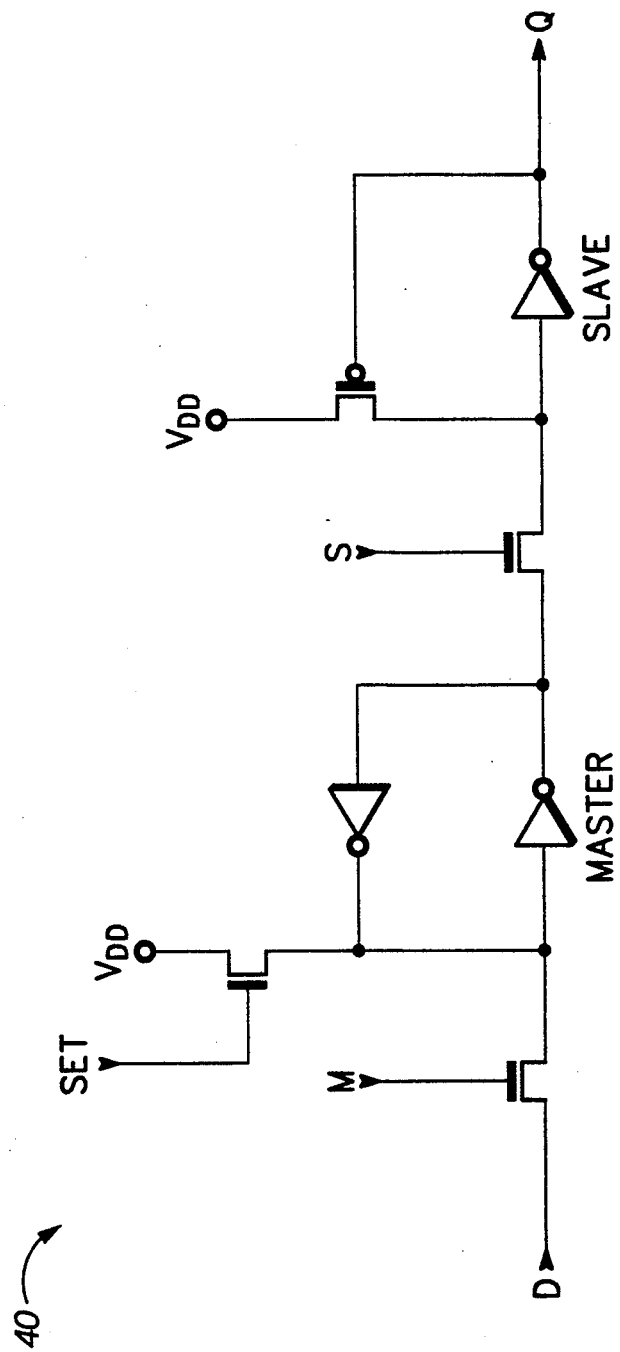
FIG. 4 illustrates in partial schematic diagram form a settable scan latch.

Accordingly, a test system 50 illustrated in FIG. 2 is a preferred embodiment of the present invention. For purposes of comparison with FIG. 1, the same circuit elements are identically numbered. Test system 50 utilizes Scan In Latches 12, Logic Under Test portion 14, Data Path Driver portion 16 with data path driver circuits 34-37, Data Path 18, and a Scan Chain portion 20 with a plurality of scan latch circuits 40-43. The Scan In Latches 12 and Logic Under Test portion 14 of FIG. 2 are identical to Scan In Latches 12 and Logic Under Test portion 14 of FIG. 1, with the notable exception that the Data Path Driver portion 16 is included within Logic Under Test portion 14 in FIG. 2. Other significant differences between test system 50 of FIG. 2 and test system 10 of FIG. 1 include the freedom to conveniently locate as desired the Scan Chain portion 20 in a topologically convenient position with respect to the outputs of Logic Under Test portion 14. Also, an important difference is a modification to each scan latch circuit in Scan Chain portion 20. Scan latch circuit 40 within Scan Chain portion 20 is illustrated in partial schematic form in FIG. 4. All remaining scan latch circuits 41-43 may be similarly implemented. The modifications from scan latch circuits 25-28 include, but are not limited to, replacing the second input, D2, within the scan latch circuits of FIG. 1 with a circuit that will activate the input of the Master portion of the scan latch circuit to an active state in response to an active output of a data path driver circuit. The input to the modified circuit of FIG. 4 that controls the activation of the Master portion of a scan latch circuit is labeled "Set".

The output of each of data path driver circuits 34–37 in Data Path Driver portion 16 connects to the Set input of a predetermined scan latch circuit in Scan Chain portion 20 of FIG. 2. The scan latch circuits of Scan Chain portion 20 are connected in series with the output of each scan latch circuit connected to an input of the following scan latch circuit. Each scan latch circuit in Scan Chain portion 20 has an input to receive a Master clock (M) and an input to receive a Slave clock (S). The input of scan latch circuit 40 of scan chain portion 20 is generally connected to a negative power supply, Vss, representing a logic low to initialize scan chain portion 20 to an inactive state. An output of scan chain circuit 40 is connected to an input of a test logic circuit (not shown) that interfaces with an external tester (not shown).

Figure 3:
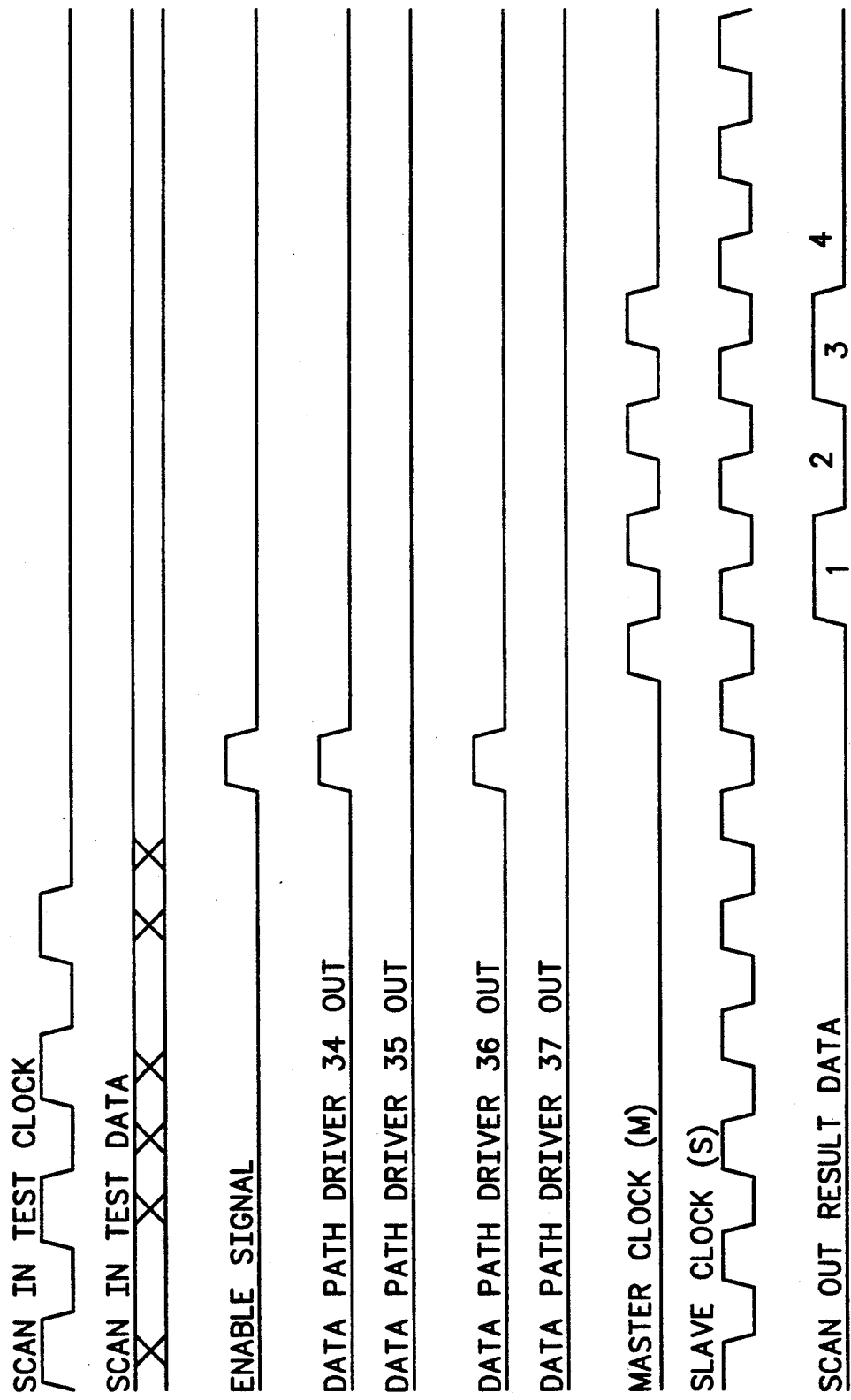
FIG. 3 illustrates in graphical form a timing diagram of the scan test system of FIG. 2.

In the test mode of operation, scan latch circuits 40–43 of Scan Chain portion 20 in FIG. 2 are first initialized to an inactive state by activating the Master and Slave clocks in an alternating fashion to shift/scan an inactive state into each of scan latch circuits 40–43 within Scan Chain portion 20. A timing sequence of the remaining test operation is illustrated in FIG. 3 and is described below. The scan in test data is shifted/scanned into the Scan In Latches 12 of FIG. 2 in the same manner as scan in test data is scanned into the Scan In Latches 12 of FIG. 1. Since Logic Under Test portion 14 is random logic, the output of Scan In Latches 12 "ripples" through Logic Under Test portion 14 and each output of Logic Under Test portion 14 remains static at the input of a predetermined one of data path driver circuits 34–37 in Data Path Driver portion 16. Next, referring to FIG. 3 the input Enable signal to each data path driver circuit in Data Path Driver portion 16 is activated once, and the output of each data path driver circuit will either remain inactive or transition from an inactive state to an active state and back to an inactive state in response to both the input Enable signal and the value of the input data to each data path driver circuit. For example, if the data input to a data path driver circuit is inactive when the input Enable signal is activated, the output of the data path driver circuit will remain inactive. If the data input to the data path driver circuit is active when the input Enable signal is activated, the output of the data path driver circuit will transition as described above. The timing diagram illustrated in FIG. 3 has as data inputs to data path drivers 34–37 a data pattern of "one-zero-one-zero", respectively. When the input Enable signal to data path drivers 34–37 is activated, the output of data path drivers 34 and 36 transition from an inactive state to an active state in response to the input Enable signal while the output of data path drivers 35 and 37 remain in the inactive state. For the above two cases, if the output of the data path driver circuit remains inactive, the master portion of a predetermined scan latch circuit within Scan Chain portion 20 will remain in the initialized inactive state, and if the data path driver circuit output is activated in response to both the data input from Logic Under Test portion 14 and the input Enable signal, the Master portion of the scan latch circuit is set to an active state. The next step is to shift/scan the latched data within the scan latch circuits 40–43 of Scan Chain portion 20 to a test logic circuit (not shown) by activating the Master and Slave clocks until the captured test data is shifted/scanned into a test logic circuit (not shown) to be read by an external tester. For example, the data pattern of the shifted/scanned data from Scan Chain portion 20 to the test logic circuit with the above described input yields an output pattern illustrated in FIG. 3 labeled "scan out result data".

Some of the advantages of the above described test system for a data processor include, but are not limited to, the inclusion of the data path driver circuits 34–37 within the Logic Under Test portion 14 such that the data path drivers are now fault tested along with all other circuitry contained within the Logic Under Test portion 14. Also, since the scan latch circuits of Scan Chain portion 20 in FIG. 2 are connected to the output of the data path drivers, which are typically high current/voltage driver circuits, the output of time critical random logic circuits contained within Logic Under Test portion 14 is not adversely affected by the capacitive loading caused by the connection of a scan latch circuit to an output signal of Logic Under Test portion 14. Furthermore, since the output of each data path driver circuit routes through the data path 18 and each of the data path drivers are strong current/voltage drivers, the above described testing method allows the freedom to locate the scan latch circuits in a topologically convenient area. By including scan latch circuits 40–43 below data path 18, the structural electrical continuity within data path 18 between data path driver portion 16 and scan latch circuits 40–43 is readily verified.

By now it should be apparent that there has been provided a data processor having an effective scan test system to fault test transistor structures while minimizing associated speed and size penalties. The present invention is particularly well suited for testing a large amount of random logic circuitry utilized in a data processing system, even though the logic circuitry is not modular or organized only in one portion of an integrated circuit layout. The present invention provides a method for minimizing speed performance of the data processing system by avoiding loading effects and not interfering with speed critical logic output paths. It should be well understood that although the above described scan test method is illustrated using data path drivers with strong current/voltage transistors, the described scan test method using a set circuit at the input to the Master portion of a Master-Slave scan latch, can be applied to other circuits that utilize scan testing techniques.

While there have been described herein the principles of the invention, it is to be clearly understood to those skilled in the art that this description is made only by way of example and not as a limitation to the scope of the invention. For example, data path drivers 34–37 and scan latch circuits 40–43 may be implemented with logic circuitry which responds to active logic low signals, and the order of described sequential scan events may be modified with little or no effect upon the testing results. Accordingly, it is intended, by the appended claims, to cover all modifications of the invention which fall within the true spirit and scope of the invention.

We claim:

1. A data processing system having scan testing for observing test data related to transistor structural testing of the system, comprising:

a plurality of test scan latches for receiving and storing predetermined input scan data and having a plurality of outputs, each output providing a predetermined test data value;

logic circuit means for performing predetermined data processing functions in the data processing system, the logic circuit means being coupled to the test scan latches and having a plurality of output driver circuits for selectively providing output control signals during each of a functional mode of operation and a test mode of operation, the test mode of operation being entered in response to receipt of the predetermined test data value from each of the test scan latches;

a data path formed by a plurality of data registers coupled to the logic circuit means, each of the data registers being controlled by a selected one of the output control signals; and a plurality of scannable latch circuits, each of the latch circuits having a control input connected to the data path and receiving a predetermined one of the output control signals, each of the output control signals being routed to at least one of the data registers in the data path prior to being connected to a predetermined one of the latch circuits, each of the latch circuits being placed in a first logic state prior to receiving the output control signals in the test mode of operation, each of the output control signals either setting a predetermined one of the latch circuits to a second predetermined logic state or allowing the predetermined one of the latch circuits to remain in the first logic state, each of the latch circuits providing a test signal in response to clocking the scannable latch circuits, the test signal indicating transistor fault information of transistors in the logic circuit means including the output driver circuits and indicating electrical continuity from the driver circuits to each control input of the scannable latch circuits.

2. The data processing system of claim 1 wherein the plurality of scannable latch circuits is a predetermined number of clocked master/slave flip-flops.

3. The data processing system of claim 1 wherein each of the plurality of output driver circuits of the logic circuit means are clocked output driver circuits having an input terminal for receiving an enable clock signal which controls when the output control signal of each clocked output driver circuit is provided during the test mode of operation and during the functional mode of operation.

4. The data processing system of claim 1 wherein each data register of the data path is coupled to a data input/output (I/O) bus for receiving and providing data.

5. In a data processing system, a method of scan testing predetermined logic circuitry of the system for obtaining test data related to transistor structural fault testing of the system, comprising the steps of:

receiving and storing predetermined input scan test data and selectively providing a plurality of predetermined test data signals;

coupling the test data signals to the predetermined logic circuitry during a test mode of operation of the system;

providing output driver circuits within the predetermined logic circuitry to provide output control signals in response to receipt of the test data signals;

providing a data path which provides and receives data from a data bus, the data path having a plurality of registers, each of the registers having a control input connected via a conductor to a predetermined one of the output control signals;

connecting a plurality of latch circuits in series, each latch circuit having a control terminal coupled to the data path and receiving a predetermined one of the output control signals which has been routed to the data path before being routed to the plurality of latch circuits;

initializing each of the latch circuits to a first predetermined logic state;

controlling each of the latch circuits with a predetermined one of the output control signals, each of the latch circuits either being set to a second predetermined logic state or remaining in the first predetermined logic state; and scanning the plurality of latch circuits to output a resultant logic state of each of the latch circuits and provide a test signal indicating transistor structural fault information of transistors in the logic circuitry including transistors of the clocked output driver circuits and indicating electrical continuity from the driver circuits to the latch circuits.

6. The method of claim 5 of scan testing predetermined logic circuitry in a data processing system wherein the step of receiving and storing predetermined input scan data further comprises:

serially clocking the scan test data into a second plurality of series-connected latch circuits in response to a scan in test clock signal and providing the predetermined test data signals in parallel via a plurality of test data signal terminals.

7. The method of claim 5 of scan testing predetermined logic circuitry in a data processing system wherein the step of initializing each of the latch circuits to a first predetermined logic state further comprises initializing each of the latch circuits to a logic zero state.

8. The method of claim 5 of scan testing predetermined logic circuitry in a data processing system wherein the step of scanning the plurality of latch circuits further comprises using master/slave latch circuits and scanning in response to a master clock signal and a slave clock signal.

9. The method of claim 5 of scan testing predetermined logic circuitry in a data processing system further comprising the step of:

using the predetermined logic circuitry in a non-test mode of the data processing system to control communication of data in a data path of the data processing system.

10. The method of claim 9 of scan testing predetermined logic circuitry wherein the step of using the predetermined logic circuitry in a non-test mode further comprises using the predetermined logic circuitry to select predetermined data registers for communicating data via a data input/output communication bus.

11. A data processing system having scan testing for providing test data related to transistor structural testing of the system, comprising:

a first plurality of test scan latch circuits for serially receiving and storing predetermined input scan data and having a plurality of parallel coupled outputs, each output providing a predetermined test data value;

logic circuit means for performing predetermined data processing functions in the data processing system, the logic circuit means having a plurality of parallel inputs coupled to the test scan latch circuits and having a plurality of clocked output driver circuits for selectively providing output control signals during each of a functional mode of operation and a test mode of operation, the test mode of operation being entered in response to receipt of the predetermined test data value from each of the test scan latch circuits;

a plurality of data registers coupled to the logic circuit means for communicating data within the system via a data input/output bus during the functional mode of operation, the output control signals selecting predetermined data registers to communicate data; and a second plurality of latch circuits, each latch circuit of the second plurality having a control input connected to the plurality of data registers and receiving a predetermined one of the output control signals, each of the output control signals being routed to at least one of the data registers prior to being connected to a predetermined one of the latch circuits of the second plurality, each latch circuit of the second plurality being placed in a first logic state prior to entering the test mode of operation, each of the output control signals either setting a predetermined one of the latch circuits of the second plurality to a second predetermined logic state or allowing the predetermined one of the latch circuits of the second plurality to remain in the first logic state, each of the latch circuits of the second plurality providing a test signal in response to clocking the second plurality of latch circuits, the test signal indicating both transistor fault information of transistors in the logic circuit means including the clocked output driver circuits and indicating electrical continuity from the clocked output driver circuits to each control input of the second plurality of latch circuits.

12. The data processing system of claim 11 wherein the second plurality of latch circuits is a predetermined number of master/slave flip-flops clocked by both a master clock signal and a slave clock signal.

13. The data processing system of claim 11 wherein each of the plurality of clocked output driver circuits of the logic circuit means has an input terminal for receiving an enable clock signal which controls when the output control signal of each of the clocked output driver circuits is provided during the test mode of operation and during the functional mode of operation.

* * * * *